(12) United States Patent
Lee et al.

(10) Patent No.: US 7,928,464 B2
(45) Date of Patent: Apr. 19, 2011

(54) LIGHT EMITTING DEVICE AND LIGHT EMITTING DEVICE PACKAGE

(75) Inventors: Sang Youl Lee, Gwangju (KR); Jun Ho Song, Yongin-si (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

(21) Appl. No.: 12/702,674

(22) Filed: Feb. 9, 2010

(65) Prior Publication Data
US 2010/0200884 A1    Aug. 12, 2010

(30) Foreign Application Priority Data

Feb. 10, 2009  (KR) .................. 10-2009-0010703

(51) Int. Cl.
*H01L 29/22* (2006.01)
(52) U.S. Cl. .................. 257/99; 257/E33.063
(58) Field of Classification Search ............... 257/96, 257/99, E33.063
See application file for complete search history.

(56) References Cited

U.S. PATENT DOCUMENTS

| | | |
|---|---|---|
| 2004/0080049 A1 | 4/2004 | Kim |
| 2005/0142677 A1 | 6/2005 | Kon et al. |
| 2006/0043387 A1 | 3/2006 | Hata |
| 2006/0225644 A1 | 10/2006 | Lee et al. |
| 2008/0035949 A1* | 2/2008 | Fudeta et al. ............. 257/99 |
| 2008/0169481 A1 | 7/2008 | Kobayashi et al. |
| 2008/0210971 A1 | 9/2008 | Donofrio et al. |
| 2008/0265267 A1 | 10/2008 | Unno |

FOREIGN PATENT DOCUMENTS

| | | |
|---|---|---|
| KR | 10-2005-0098213 B1 | 10/2005 |
| KR | 10-2007-0013291 A | 1/2007 |
| KR | 10-2008-0018299 A | 2/2008 |
| KR | 10-2008-0102538 A | 11/2008 |

* cited by examiner

*Primary Examiner* — Thomas L Dickey
(74) *Attorney, Agent, or Firm* — Birch, Stewart, Kolasch & Birch, LLP (57) ABSTRACT

A light emitting device is provided. The light emitting device comprises: a conductive support substrate; a bonding layer on the conductive support substrate; a reflective layer on the bonding layer; and a light emitting structure layer on the reflective layer. The bonding layer comprises a solder bonding layer on the conductive support substrate and at least one of a diffusion barrier layer and an adhesion layer on the solder bonding layer, the solder bonding layer, the diffusion barrier layer, and the adhesion layer being formed of a metal or an alloy of which the Young's Modulus is 9 GPa to 200 GPa.

8 Claims, 6 Drawing Sheets

LIGHT EMITTING DEVICE AND LIGHT EMITTING DEVICE PACKAGE

CROSS-REFERENCE TO RELATED APPLICATIONS

The present application claims priority under 35 U.S.C. §119(e) of Korean Patent Application No. 10-2009-0010703 (filed on Feb. 10, 2009), which is hereby incorporated by reference in its entirety.

BACKGROUND

The present disclosure relates to a light emitting device and a light emitting device package.

A light emitting diode (LED) is a kind of a semiconductor device for converting electric energy into light. The LED has advantages such as low power consumption, a semi-permanent life cycle, a fast response time, safety, and environment friendly compared to the related art light source such as a fluorescent lamp and an incandescent bulb. Many studies are being in progress in order to replace the related art light source with an LED, and the LED is being increasingly used according to the trend as a light source of lighting equipment such as a variety of lamps, a liquid crystal display device, a scoreboard, a streetlight in indoor and outdoor places.

In the LED, a stacked light emitting structure layer includes a first conductive semiconductor layer, an active layer, and a second conductive semiconductor layer, and the light is generated from the light emitting structure layer according to an applied power supply.

In the LED, an epi-layer is used to form the light emitting structure layer on a growth substrate such as a sapphire substrate, and then a reflective layer is formed on the light emitting structure layer. Moreover, after bonding of the reflective layer and a conductive support substrate, an LED having a vertical structure is manufactured through a process for removing the growth substrate.

In addition, when the growth substrate is separated through a laser beam, due to a mechanical impact and explosive power of $N_2$ gas occurring during a thermo-chemical decomposition of a buffer layer material, crack or breaking occurs in the epi-layer.

Furthermore, in a case of Au—Sn, Au—In, Pd—In, Pd—Sn (i.e., a solder bonding material system) used for bonding the reflective layer and the conductive support substrate, materials such as Pt, W, and Cr are used as a diffusion barrier layer to prevent fast diffusion of Sn or In. At this point, in a case of Pt, a solder bonding material has an embrittlement property due to depletion of Sn or In and in a case of W and Cr, separation occurs due to a poor adhesiveness of Sn or In.

SUMMARY

The embodiments provide a light emitting device with a new structure.

The embodiments provide a light emitting device capable of preventing crack and breaking phenomenon occurring during the growth substrate separation.

The embodiments provide a light emitting device for preventing a solder bonding material from diffusing to a reflective layer or a light emitting structure layer The embodiments provide a light emitting device for improving embrittlement and adhesiveness.

In an embodiment, a light emitting device comprises: a conductive support substrate; a bonding layer on the conductive support substrate; a reflective layer on the bonding layer; and a light emitting structure layer on the reflective layer, wherein the bonding layer comprises a solder bonding layer on the conductive support substrate and at least one of a diffusion barrier layer and an adhesion layer on the solder bonding layer, the solder bonding layer, the diffusion barrier layer, and the adhesion layer being formed of a metal or an alloy of which the Young's Modulus is 9 GPa to 200 GPa.

In another embodiment, a light emitting device comprises: a conducive support substrate; a solder bonding layer on the conductive support substrate; a diffusion barrier layer on the solder bonding layer; an adhesion layer on the diffusion barrier layer; a reflective layer on the adhesion layer; and a light emitting structure layer on the reflective layer, wherein: the solder bonding layer, the diffusion barrier layer, and the adhesion layer are formed of a metal or an alloy; and the diffusion barrier layer or the adhesion layer is formed of a metal or an alloy including Cu or Nb.

In further another embodiment, a light emitting device package comprises: a package body; a first electrode and a second electrode installed on the package body; and a light emitting device connected to the first electrode and the second electrode electrically, wherein the light emitting device comprises: a conductive support substrate; a bonding layer on the conductive support substrate; a reflective layer on the bonding layer; and a light emitting structure layer on the reflective layer, wherein the bonding layer comprises a solder bonding layer on the conductive support substrate and at least one of a diffusion barrier layer and an adhesion layer on the solder bonding layer, the solder bonding layer, the diffusion barrier layer, and the adhesion layer being formed of a metal or an alloy of which the Young's Modulus is 9 GPa to 200 GPa.

The details of one or more embodiments are set forth in the accompanying drawings and the description below. Other features will be apparent from the description and drawings, and from the claims.

DETAILED DESCRIPTION OF THE EMBODIMENTS

In the descriptions of embodiments, it will be understood that when a layer (or film), a region, a pattern, or a structure is referred to as being 'on/above/over/upper' substrate, each layer (or film), a region, a pad, or patterns, it can be directly on substrate each layer (or film), the region, the pad, or the patterns, or intervening layers may also be present. Further, it will be understood that when a layer is referred to as being 'under/below/lower' each layer (film), the region, the pattern, or the structure, it can be directly under another layer (film), another region, another pad, or another patterns, or one or more intervening layers may also be present. Therefore, meaning thereof should be judged according to the spirit of the present disclosure.

In the figures, a dimension of each of elements may be exaggerated for clarity of illustration, and the dimension of each of the elements may be different from an actual dimension of each of the elements. Not all elements illustrated in the drawings must be included and limited to the present disclosure, but the elements except essential features of the present disclosure may be added or deleted.

Hereinafter, a light emitting device, a method of manufacturing the same, and a light emitting device package will be described below with reference to the accompanying drawings.

Figure 1:
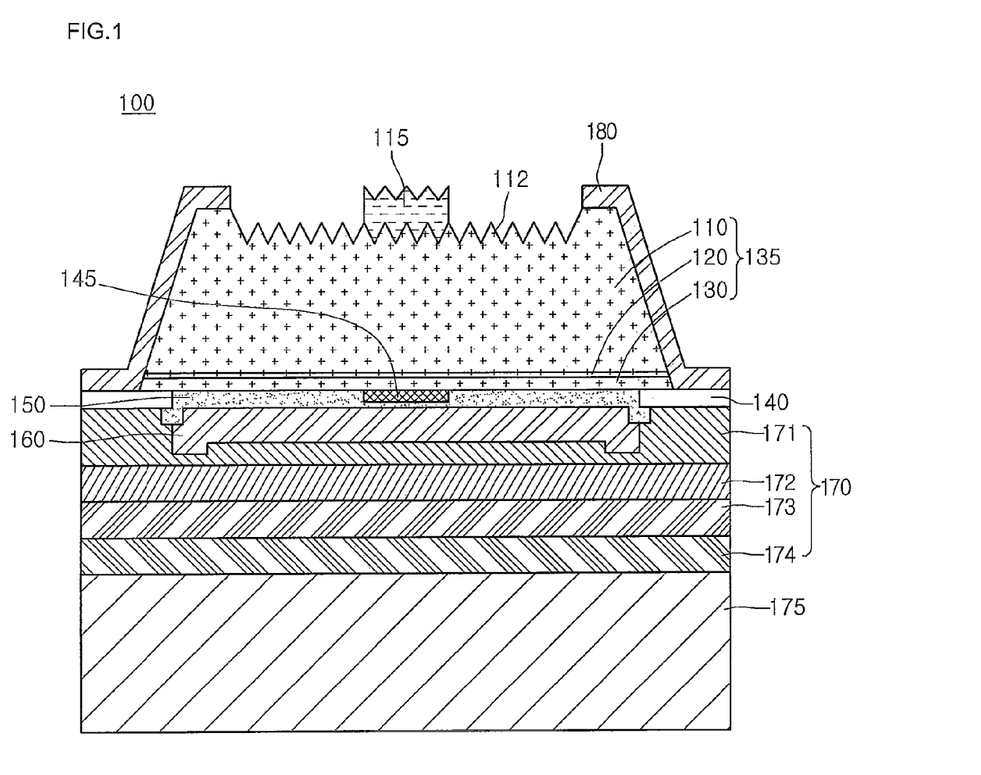
FIG. 1 is a view illustrating a light emitting device according to an embodiment.

FIG. 1 is a view illustrating a light emitting device according to an embodiment.

Referring to FIG. 1, the light emitting device 100 includes a conductive support substrate 175, a bonding layer 170 on the conductive support substrate 175, a reflective layer 160 on the bonding layer 170, an ohmic contact layer 150 on the reflective layer 160, a protective layer 140 on a boundary region of the top of the bonding layer 170, a light emitting structure layer 135 on the ohmic contact layer 150 and the protective layer 140 to generate light, a passivation layer 180 for protecting the light emitting structure layer 135, a current blocking layer 145 between the reflective layer 160 and the light emitting structure layer 135, and an electrode unit 115 on the light emitting structure layer 135.

The conductive support substrate 175 supports the light emitting structure layer 135. The conductive support substrate 175 and the electrode unit 115 may apply a power to the light emitting structure layer 135. The conductive support substrate 175 includes at least one of Copper (Cu), Gold (Au), Nickel (Ni), Molybdenum (Mo), Copper-Tungsten (Cu—W), a carrier wafer (for example, Si, Ge, GaAs, ZnO, Sic, etc). The thickness of the conductive support substrate 175 may vary according to a design of the light emitting device 100, and may be 50 μm to 300 μm, for example.

The bonding layer 170 is formed on the conductive support substrate 175. The bonding layer 170 is formed below the reflective layer 160 and the protective layer 140. The bonding layer 170 contacts the reflective layer 160, the ohmic contact layer 150, and the protective layer 140 to allow them strongly to bond to the conductive support substrate 175.

The bonding layer 170 includes a solder bonding layer with a first solder bonding layer 173 and a second solder bonding layer 174, a diffusion barrier layer 172 on the first solder bonding layer 173, and an adhesion layer 171 on the diffusion barrier layer 172.

The bonding layer 170 prevents crack and breaking phenomenon occurring during a separation of a growth substrate, and also prevents a solder bonding material from being diffused into the reflective layer 160 or the light emitting structure layer 135. Also, the bonding layer 170 is formed to improve embrittlement and adhesiveness.

In the bonding layer 170, the adhesion layer 171 or the diffusion barrier layer 172 may be formed of a metal or an alloy of which the Young's Modulus is 9 GPa to 200 GPa and the first solder bonding layer 173 and the second solder bonding layer 174 may be formed of a material for a solder bonding alloy of which the Young's Modulus is 9 GPa to 200 GPa.

For example, the adhesion layer 171 may be formed with a thickness of 0.05 μm to 0.2 μm. The diffusion barrier layer 172 may be formed with a thickness of 1 μm to 3 μm. The solder bonding layer including the first solder bonding layer 173 and the second solder bonding layer 174 may be formed with a thickness of 2 μm to 4 μm.

For example, the adhesion layer 171 or the diffusion barrier layer 172 may be formed of a metal or an ally including at least one of Cu(129), Nb(105), Sn(49), In(10.1), Sc(79.3), Ta(185.7), V(127.7), Si(113), Ag(82.7), Au(130), Zn(104.5), Sb(54.7), Al(70.6), Ge(79.9), Hf(141), La(37.9), Mg(44.7), Mn(191), Ni(199), Pd(121), and Ti(120). Moreover, for example, the first solder bonding layer 173 and the second solder bonding layer 174 may be formed of a metal or an alloy including at least one of Sn(49), In(10.5), Ga(9.8), Bi(34), Pb(16), and Au(130). However, the number in a parenthesis represents the Young's Modulus (GPa unit).

If materials used for the bonding layer 170 have the Young's Modulus of 9 GPa to 200 GPa, crack and breaking phenomenon occurring during the separation of the growth substrate can be prevented. Materials used for the adhesion layer 171 or the diffusion barrier layer 172 may prevent the diffusion of Sn or In of the first solder bonding layer 173 and the second solder bonding layer 174.

The adhesion layer 171 and the diffusion barrier layer 172 may be formed of the same material or respectively different materials. If the same material is used, only one of the adhesion layer 171 and the diffusion barrier layer 172 is formed.

In addition, the diffusion barrier layer 172 may be formed through an electro-plating or electroless-plating method besides physical vapor deposition (PVD) according to kinds of a selected material.

In this embodiment, the diffusion barrier layer 172 is formed of Cu or Nb, and has an excellent property for preventing crack and breaking phenomenon and diffusion of Sn or In.

For example, the adhesion layer 171/the diffusion barrier layer 172/the first and second solder bonding layers 173 and 174 may be formed of one of Ti—Ni/Cu/Au—Sn, Nb/Cu/Au—Sn, Nb/Nb—Sn/Au—In, or Nb/Nb/Au—Sn.

The reflective layer 160 may be formed on the bonding layer 170. The reflective layer 160 reflects light incident from the light emitting structure layer 135 such that light extraction efficiency can be improved. The reflective layer 160 may be selectively formed and may not be necessarily formed.

The reflective layer 160 may be formed of a metal or an alloy including at least one of Ag, Ni, Al, Rh, Pd, Ir, Ru, Mg, Zn, Pt, Au, and Hf. In addition, the reflective layer 160 may be formed with a multilayer using the above metal or alloy and a transparent conductive material such as IZO, IZTO, IAZO, IGZO, IGTO, AZO, and ATO. For example, the reflective layer 160 may be stacked by IZO/Ni, AZO/Ag, IZO/Ag/Ni, or AZO/Ag/Ni. For example, the reflective layer 160 may be formed of a metal or an alloy, which includes Ag.

In this embodiment, although it is illustrated that the top of the reflective layer 160 contacts the ohmic contact layer 150, the reflective layer 160 may contact the protective layer 140, the current blocking layer 145, or the light emitting structure layer 135.

The ohmic contact layer 150 may be formed on the reflective layer 160. The ohmic contact layer 150 ohmic-contacts the second conductive semiconductor layer 130 to smoothly provide a power to the light emitting structure layer 135 and may include at least one of ITO, IZO, IZTO, IAZO, IGZO, IGTO, AZO, and ATO. The ohmic contact layer 150 may be selectively formed and may not be necessarily formed.

That is, the ohmic contact layer 150 may selectively use a transparent conductive layer and a metal, and also may be realized with a single layer or a multilayer including at least one of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IrOx, RuOx, RuOx/ITO, Ni, Ag, Ni/IrOx/Au, and Ni/IrOx/Au/ITO In this embodiment, although it is illustrated that the ohmic contact layer 150 contacts the bottom and side of the current blocking layer 145, the ohmic contact layer 150 may be disposed being spaced apart from the current blocking layer 145 or may contact only the side of the current blocking layer 145. Moreover, the reflective layer 160 may be formed of a material that ohmic-contacts the second conductive semiconductor layer 130, and the ohmic contact layer 150 may not be formed.

The current blocking layer 145 may be formed between the ohmic contact layer 150 and the second conductive semiconductor layer 130. The current blocking layer 145 has the top that contracts the second conductive semiconductor layer 130 and also has the bottom and side that contact the ohmic contact layer 150.

The current blocking layer 145 may be formed and its portion may vertically overlap the electrode unit 115. Therefore, a phenomenon that current is concentrated on the shortest distance between the electrode unit 115 and the conductive support substrate 175 is alleviated to improve luminescence efficiency of the light emitting device 100.

The current blocking layer 145 may be formed of a material having a lower electrical conductivity than the reflective layer 160 or the ohmic contact layer 150, a material for Schottky contact with the second conductive semiconductor layer 130, or an electrical insulation material, and may include at least one of ITO, IZO, IZTO, IAZO, IGZO, IGTO, AZO, ATO, ZnO, $SiO_2$, $SiO_x$, $SiO_xN_y$, $Si_3N_4$, $Al_2O_3$, $TiO_x$, Ti, Al, and Cr, for example.

The current blocking layer 145 may not be necessarily formed, and may be omitted according to a structure of the light emitting device 100.

The protective layer 140 may be formed on a boundary region of the top of the bonding layer 170. That is, the protective layer 140 may be formed on the boundary region between the light emitting structure layer 135 and the bonding layer 170, and may be formed of a conductive protective layer using a conductive material or a non-conductive protective layer using a non-conductive material.

The conductive protective layer may be formed of a transparent conductive oxide layer or may include at least one of Ti, Ni, Pt, Pd, Rh, Ir, and W. For example, the transparent conductive oxide layer may be formed of at least one of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), and gallium zinc oxide (GZO).

In addition, if isolation etching is performed on the light emitting structure layer 135 to separate the light emitting structure layer 135 by a unit chip without the protective layer 140 during a chip separation process, fragments are generated from the bonding layer 170. The fragments are attached between the second conductive semiconductor layer 130 and the active layer 120 or between the active layer 120 and the first conductive semiconductor layer 110, such that electrical short may occur. Accordingly, the conductive protective layer is formed of a material that is not cracked or does not generate fragments during isolation etching. Therefore, the fragments of the bonding layer 170 are not generated and the electrical short is not occurred.

Since the conductive protective layer has electrical conductivity, current may be injected on the light emitting structure 135 through the conductive protective layer. Accordingly, light may effectively occur at the active layer 120 disposed on the conductive protective layer on a boundary region of the light emitting structure layer 135 and also light efficiency of the light emitting device can be improved.

Moreover, the conductive protective layer reduces an operating voltage increased by the current blocking layer 145, such that the operating voltage of the light emitting device can be lowered.

The conductive protective layer may be formed of the same material as the ohmic contact layer 150.

The non-conductive protective layer has very low electrical conductivity and thus may be substantially formed of a non-conductive material. The non-conductive protective layer may be formed of a material having a considerably lower electrical conductivity than the reflective layer 160 or the ohmic contact layer 150, a material for Schottky contact with the second conductive semiconductor layer 130, or an electrical insulation material. For example, the non-conductive protective layer may be formed of ZnO or $SiO_2$.

The non-conductive protective layer increases the distance between the bonding layer 170 and the active layer 120. Accordingly, probability that electrical short occurs between the bonding layer 170 and the active layer 120 can be reduced.

In addition, if isolation etching is performed on the light emitting structure layer 135 to separate the light emitting structure layer 135 by a unit chip without the non-protective layer 140 during a chip separation process, fragments are generated from the bonding layer 170. The fragments are attached between the second conductive semiconductor layer 130 and the active layer 120 or between the active layer 120 and the first conductive semiconductor layer 110, such that electrical short may occur.

The non-conductive protective layer is formed of a material that is not cracked or does not generate fragments during isolation etching or an electrical insulation material that does not cause electrical short even if its portion is cracked or a small amount of fragments are generated. Therefore, the fragments of the bonding layer 170 are not generated and the short circuit is not occurred.

The protective layer 140 partially overlaps the light emitting structure layer 135 in a vertical direction.

The protective layer 140 increases the distance of the side between the bonding layer 170 and the active layer 120. Accordingly, probability that electrical short occurs between the bonding layer 170 and the active layer 120 can be reduced.

The protective layer 140 may not be necessarily formed, and may be omitted according to a structure of the light emitting device 100.

The light emitting structure layer 135 may be formed on the ohmic contact layer 150 and the protective layer 140.

An inclined plane may be formed at the side of the light emitting structure layer 135 while isolation etching is performed for the separation of a unit chip, and a portion of the inclined plane overlaps the protective layer 140 in a vertical direction.

A partial top of the protective layer 140 may be exposed by the isolation etching. Accordingly, the protective layer 140 contacts a partial region of the light emitting structure layer 135 in a vertical direction and the remaining portion does not contact the light emitting structure layer 135 in a vertical direction.

The light emitting structure layer 135 may include a compound semiconductor layer of a plurality of Group III to Group V elements, and may include a first conductive semiconductor layer 110, an active layer 120 below the first conductive semiconductor layer 110, and the second conductive semiconductor layer 130 below the active layer 120.

The first conductive semiconductor layer 110 may be formed of a compound semiconductor of Group III to Group V elements doped with a first conductive dopant, for example, GaN, AlN, AlGaN, InGaN, InN, InAlGaN, AlInN, AlGaAs, GaP, GaAs, GaAsP, and AlGaInP. If the first conductive semiconductor layer 110 is an N-type semiconductor layer, the first conductive dopant includes an N-type dopant such as Si, Ge, Sn, Se, and Te. The first conductive semiconductor layer 110 may be formed with a single layer or a multilayer, but is not limited thereto.

The active layer 120 is formed below the first conductive semiconductor layer 110 and may include any one of a single quantum well structure, a multiple quantum well (MQW) structure, a quantum dot structure, and a quantum wire structure. The active layer 120 may be formed of a well layer and a barrier layer using a compound semiconductor material of Group III to Group V elements, such as InGaN well layer/GaN barrier layer or InGaN well layer/AlGaN barrier layer.

A clad layer may be formed between the active layer 120 and the first conductive semiconductor layer 110 or between the active layer 120 and the second conductive semiconductor layer 130. The clad layer may be formed of an AlGaN based semiconductor.

The second conductive semiconductor layer 130 may be formed below the active layer 120 and is formed of a compound semiconductor of Group III to Group V elements doped with a second conductive dopant, for example, GaN, AlN, AlGaN, InGaN, InN, InAlGaN, AlInN, AlGaAs, GaP, GaAs, GaAsP, and AlGaInP. If the second conductive semiconductor layer 130 is a P-type semiconductor layer, the second conductive dopant includes a P-type dopant such as Mg and Zn. The second conductive semiconductor layer 130 may be formed with a single layer or a multilayer, and is not limited thereto.

In addition, the light emitting structure layer 135 may include an N-type semiconductor layer below the second conductive semiconductor layer 130. For example, the light emitting structure layer 135 may include at least one of N-P junction, P-N junction, N-P-N junction and P-N-P junction structures.

The electrode unit 115 is formed on the light emitting structure layer 135. The electrode unit 115 may include a pad part for wire bonding and a finger part extending from the pad part. The finger part may be divided with a predetermined pattern and may be formed with various forms.

A roughness pattern 112 may be formed on the top of the first conductive semiconductor layer 110 to achieve light extraction efficiency. Accordingly, a roughness pattern may be formed on the electrode unit 115 and is not limited thereto.

The passivation layer 180 may be formed on at least the side of the light emitting structure layer 135. Moreover, the passivation layer 180 may be formed on the first conductive semiconductor layer 110 and the protective layer 140, but is not limited thereto.

The passivation layer 180 may be formed to electrically protect the light emitting structure layer 135.

For example, the passivation layer 180 may be formed of at least one of oxide silicon ($SiO_x$), oxide nitride silicon ($SiO_xN_y$), nitride silicon ($Si_3N_4$), and oxide aluminum ($Al_2O_3$).

Hereinafter, a method of manufacturing a light emitting device will be described in more detail according to an embodiment. However, the overlapping description will be omitted or briefly described again.

FIGS. 2 to 11 are views illustrating a method of manufacturing a light emitting device according to an embodiment.

Figure 2:
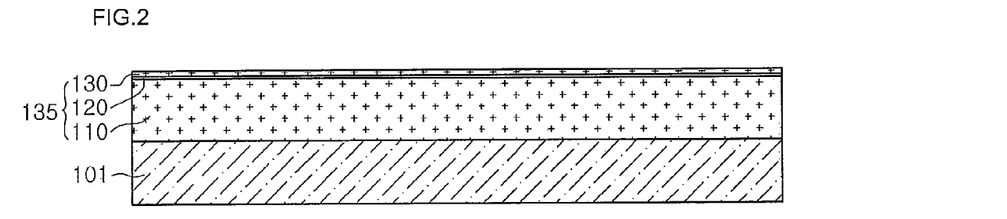
FIGS. 2 to 11 are views illustrating a method of manufacturing a light emitting device according to an embodiment.

Referring to FIG. 2, a light emitting structure layer 135 is formed on a growth substrate 101. The growth substrate 101 may be formed of at least one of sapphire ($Al_2O_3$), SiC, GaAs, GaN, ZnO, Si, GaP, InP, and Ge, and is not limited thereto.

The light emitting structure layer 135 may be formed by growing a first conductive semiconductor layer 110, an active layer 120, and a second conductive semiconductor layer 130 on the growth substrate 101.

The light emitting structure layer 135 may be formed through various methods such as Metal Organic Chemical Vapor Deposition (MOCVD), Chemical Vapor Deposition (CVD), Plasma-Enhanced Chemical Vapor Deposition (PECVD), Molecular Beam Epitaxy (MBE), and Hydride Vapor Phase Epitaxy (HVPE), and is not limited thereto.

In addition, a buffer layer (not shown) and/or an undoped nitride layer (not shown) may be formed between the light emitting structure layer 135 and the growth substrate 101 in order to alleviate a lattice mismatch due to a lattice constant difference.

Figure 3:
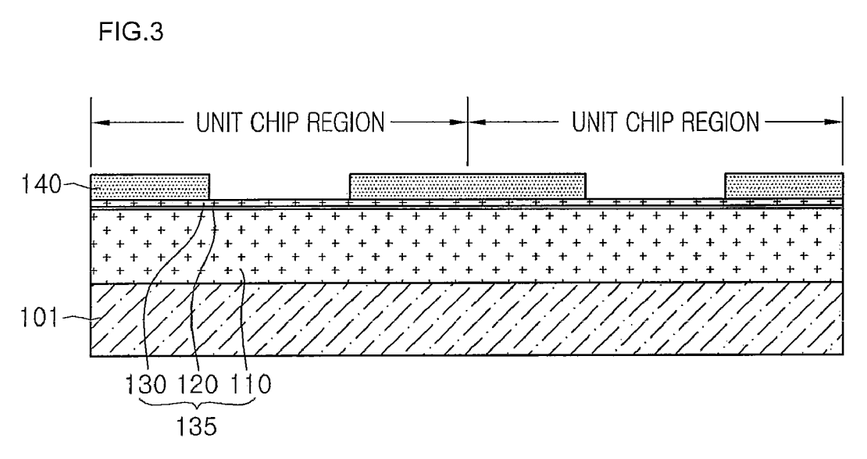

Referring to FIG. 3, a protective layer 140 is selectively formed on the light emitting structure layer 135, being corresponding to a unit chip region.

The protective layer 140 may be formed on a boundary of the unit chip region using a mask pattern. The protective layer 140 may be formed using various deposition methods such as a sputtering method.

Figure 4:
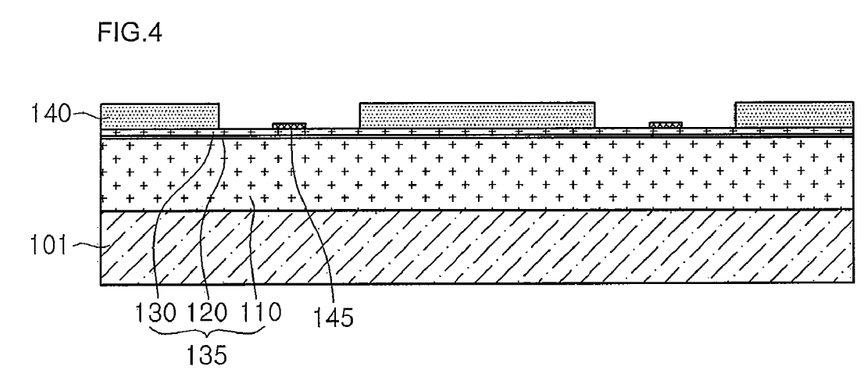

Referring to FIG. 4, a current blocking layer 145 may be formed on the second conductive semiconductor layer 130. The current blocking layer 145 may be formed using a mask pattern.

The protective layer 140 and the current blocking layer 145 may be formed of the same material. In this case, the protective layer 140 and the current blocking layer 145 may be simultaneously formed using one process without an additional process. For example, after a $SiO_2$ layer is formed on the second conductive semiconductor layer 130, the protective layer 140 and the current blocking layer 145 may be simultaneously formed using a mask pattern.

Figure 5:
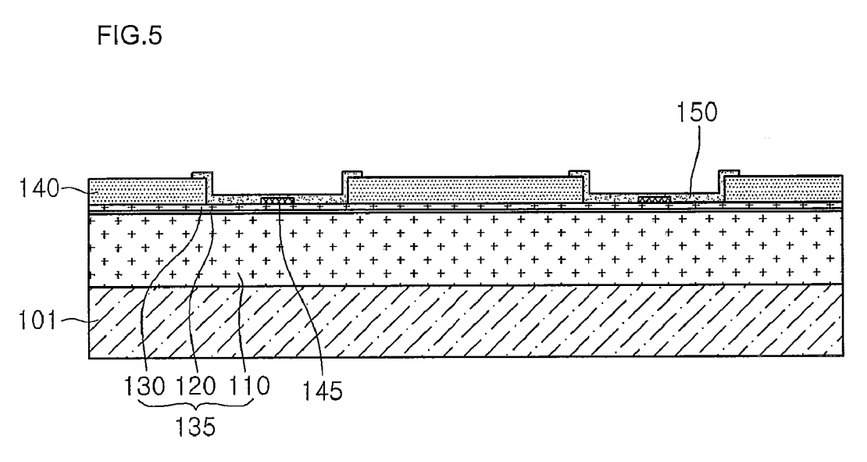
Figure 6:
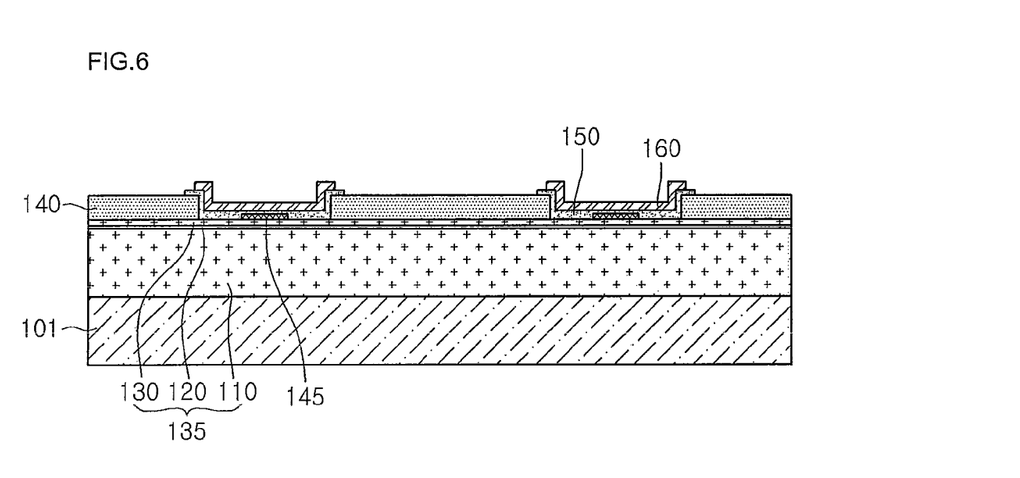

Referring to FIGS. 5 and 6, an ohmic contact layer 150 is formed on the second conductive semiconductor layer 130 and the current blocking layer 145, and then a reflective layer 160 may be formed on the ohmic contact layer 150.

The ohmic contact layer 150 and the reflective layer 160 may be formed using one of E-beam deposition, Sputtering, and Plasma Enhanced Chemical Vapor Deposition (PECVD).

Figure 7:
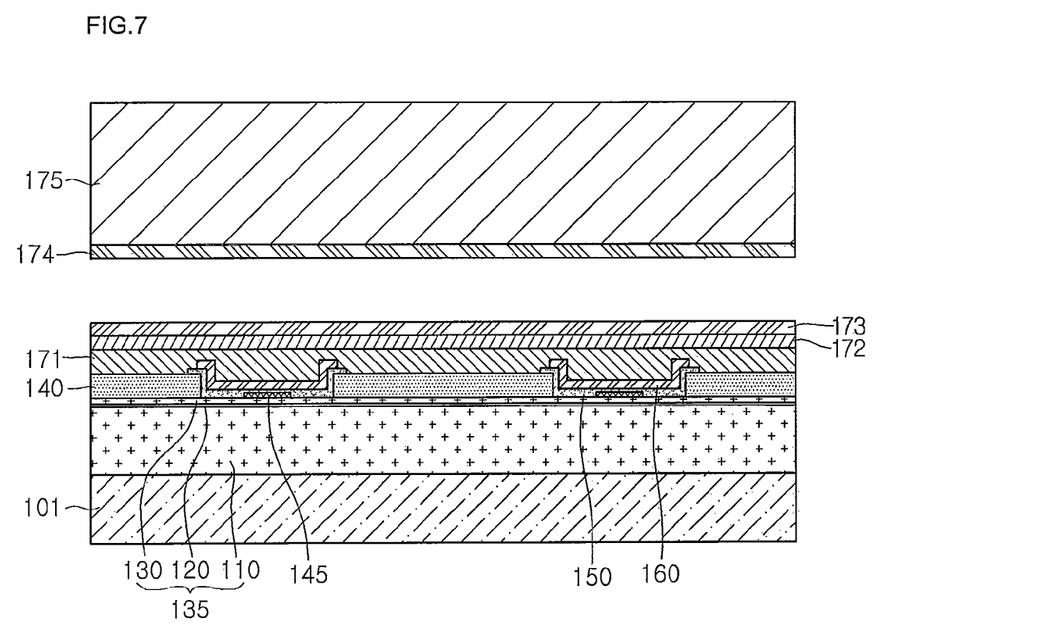
Figure 8:
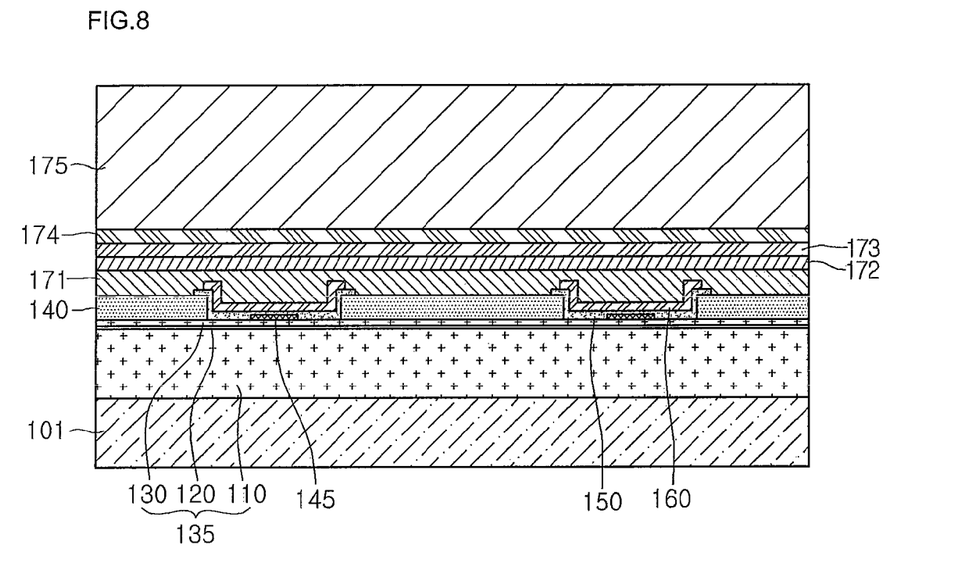

Referring to FIGS. 7 and 8, a conductive support substrate 175 is prepared.

An adhesion layer 171, a diffusion barrier layer 172, and a first solder bonding layer 173 are formed on the protective layer 140 and the reflective layer 160, and then a second solder bonding layer 174 is formed on the conductive support substrate 175. For example, the adhesion layer 171, the first solder bonding layer 173, and the second solder bonding layer 174 are formed using a PVD method, and the diffusion barrier layer 172 may be formed using an electro-plating or electroless-plating method besides the PVD method.

Furthermore, since the first solder bonding layer 173 is attached to the second solder bonding layer 174, the structure of FIG. 6 is attached to the conductive support substrate 175 by a bonding layer 170.

Figure 9:
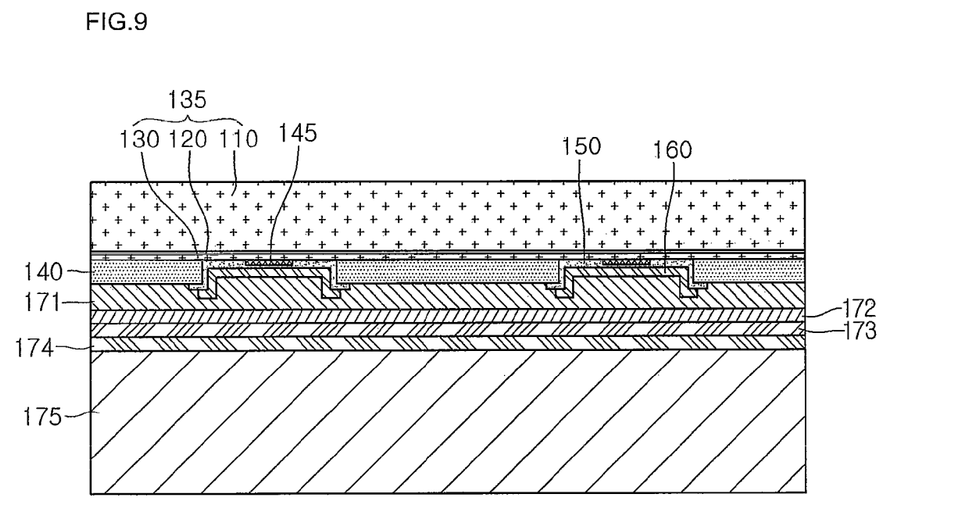

Referring to FIG. 9, the growth substrate 101 is removed from the light emitting structure layer 135. FIG. 9 is a reversed view of the structure of FIG. 8.

The growth substrate 101 may be removed by a Laser Lift Off method or a Chemical Lift Off method.

Since materials used for the bonding layer 170 have the Young's Modulus of 9 GPa to 200 GP, crack and breaking phenomenon occurring during the separation of the growth substrate 101 can be prevented.

Figure 10:
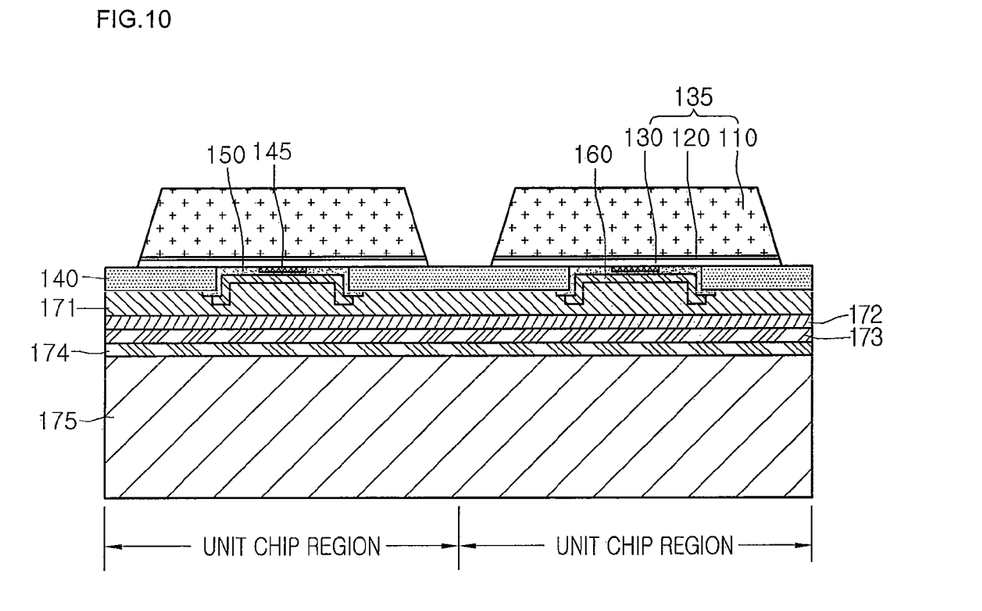

Referring to FIG. 10, isolation etching is performed on the light emitting structure layer 135 by a unit chip region, such that a plurality of light emitting structure layers 135 are divided. For example, the isolation etching may be performed using a dry etching method such as Inductively Coupled Plasma (ICP).

Figure 11:
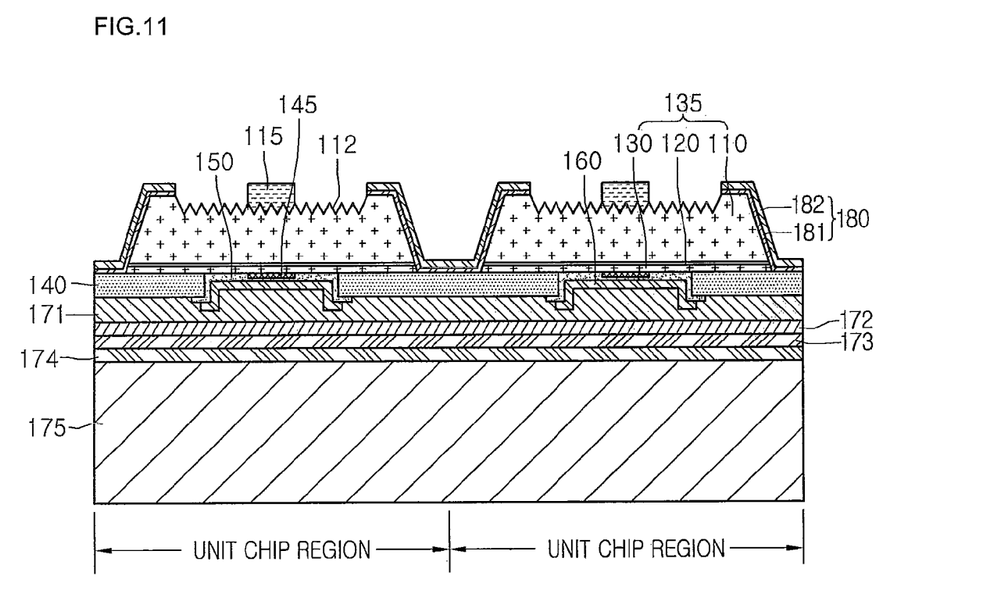

Referring to FIG. 11, a passivation layer 180 is formed on the protective layer 140 and the light emitting structure layer 135, and then is selectively removed to expose the top of the first conductive semiconductor layer 110.

Then, a roughness pattern 112 is formed on the first conductive semiconductor layer 110 to improve light extraction efficiency, and an electrode part 115 is formed on the roughness pattern 112. The roughness pattern 112 may be formed through a wet etching process or a dry etching process.

Then, the structure is separated by a unit chip region through a chip separation process such that a plurality of light emitting devices can be manufactured.

The chip separation process may include a breaking process for separating a chip by applying a physical impact using a blade, a laser scribing process for separating a chip by projecting laser on a chip boundary, and an etching process including wet or dry etching, but is not limited thereto.

Figure 12:
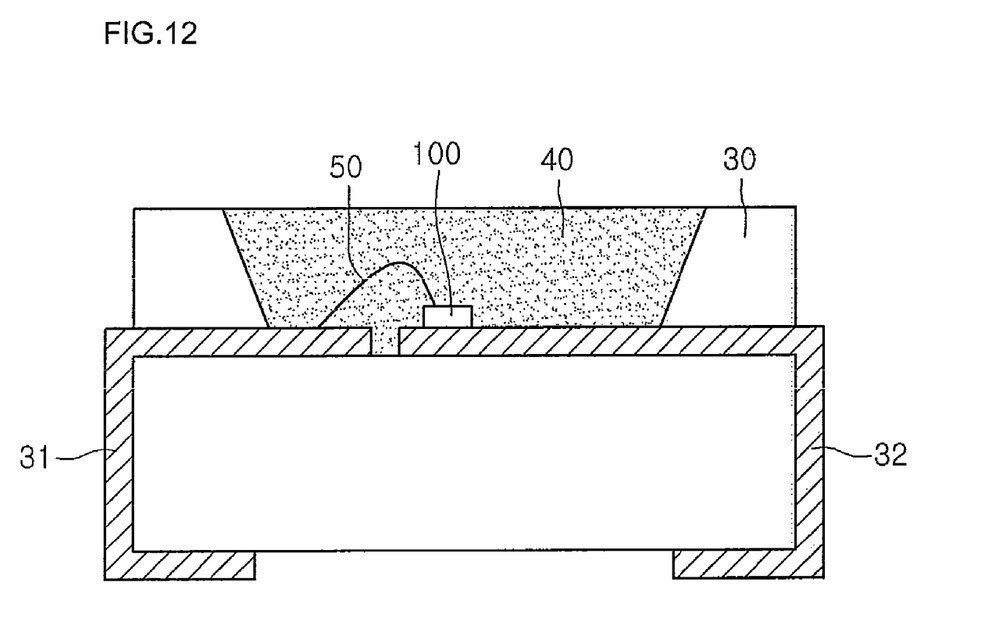
FIG. 12 is a sectional view of a light emitting device package including a light emitting device according to an embodiment.

FIG. 12 is a sectional view of a light emitting device package including a light emitting device according to an embodiment.

Referring to FIG. 12, the light emitting device package includes a package body 30, a first electrode 31 and a second electrode 32 installed at the package body 30, a light emitting device 100 installed at the package body 30 to electrically connect to the first electrode 31 and the second electrode 32, and a molding member 40 surrounding the light emitting device 100.

The package body 30 may be formed including a silicon material, a synthetic resin material, or a metal material, and may have a cavity whose side is inclined.

The first electrode 31 and the second electrode 32 are electrically separated from each other and provide a power to the light emitting device 100. In addition, the first electrode 31 and the second electrode 32 reflects a light generated from the light emitting device 100 to increase light efficiency, and exhausts a heat generated from the light emitting device 100 to the external.

The light emitting device 100 is installed on the package body 30, the first electrode 31, or the second electrode 32.

The light emitting device 100 may be electrically connected to one of the first electrode 31 and the second electrode 32 using one of a wire method, a flip chip method, or a die bonding method. In this embodiment, it is illustrated that the light emitting device 100 is electrically connected to the first electrode 31 through a wire 50 and directly electrically contacts the second electrode 32.

The molding member 40 surrounds the light emitting device 100 such that the light emitting device 100 can be protected. In addition, the molding member 40 includes a fluorescent substance such that a wavelength of a light emitted from the light emitting device 100 can be changed.

The embodiments can provide a light emitting device with a new structure.

The embodiments can provide a light emitting device capable of preventing crack and breaking phenomenon occurring during the growth substrate separation.

The embodiments can provide a light emitting device for preventing a solder bonding material from diffusing to a reflective layer or a light emitting structure layer The embodiments can provide a light emitting device for improving embrittlement and adhesiveness.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device comprising:
a conductive substrate;
a solder bonding layer on the conductive substrate;
a diffusion barrier layer on the solder bonding layer;
an adhesive layer on the diffusion barrier layer;
a reflective layer on the adhesive layer; and
a light emitting semiconductor layer on the reflective layer,
wherein the bonding layer, the diffusion barrier layer and the adhesive layer include a metal or an alloy having young's modulus of 200 GPa or less, and the diffusion barrier layer or the adhesive layer includes a metal or an alloy including Cu or Nb, and
the adhesive layer includes Ti—Ni, the diffusion barrier layer includes Cu, and the bonding layer includes Au—Sn.

2. The light emitting device as claimed in claim 1, wherein the bonding layer is formed of a metal or an alloy comprising at least one selected from the group consisting of Sn, In, Ga, Bi, Pb, and Au.

3. A light emitting device comprising:
a conductive substrate;
a solder bonding layer on the conductive substrate;
a diffusion barrier layer on the solder bonding layer;
an adhesive layer on the diffusion barrier layer;
a reflective layer on the adhesive layer; and
a light emitting semiconductor layer on the reflective layer,
wherein the bonding layer, the diffusion barrier layer and the adhesive layer include a metal or an alloy having young's modulus of 200 GPa or less, and the diffusion barrier layer or the adhesive layer includes a metal or an alloy including Cu or Nb, and
the adhesive layer includes Nb, the diffusion barrier layer includes Cu, and the bonding layer includes Au—Sn.

4. The light emitting device as claimed in claim 3, wherein the bonding layer is formed of a metal or an alloy comprising at least one selected from the group consisting of Sn, In, Ga, Bi, Pb, and Au.

5. A light emitting device comprising:
a conductive substrate;
a solder bonding layer on the conductive substrate;
a diffusion barrier layer on the solder bonding layer;
an adhesive layer on the diffusion barrier layer;
a reflective layer on the adhesive layer; and
a light emitting semiconductor layer on the reflective layer,
wherein the bonding layer, the diffusion barrier layer and the adhesive layer include a metal or an alloy having young's modulus of 200 GPa or less, and the diffusion barrier layer or the adhesive layer includes a metal or an alloy including Cu or Nb, and the adhesive layer includes Nb, the diffusion barrier layer includes Nb—Sn, and the bonding layer includes Au—In.

6. The light emitting device as claimed in claim 5, wherein the bonding layer is formed of a metal or an alloy comprising at least one selected from the group consisting of Sn, In, Ga, Bi, Pb, and Au.

7. A light emitting device comprising:
a conductive substrate;
a solder bonding layer on the conductive substrate;
a diffusion barrier layer on the solder bonding layer;
an adhesive layer on the diffusion barrier layer;
a reflective layer on the adhesive layer; and
a light emitting semiconductor layer on the reflective layer,
wherein the bonding layer, the diffusion barrier layer and the adhesive layer include a metal or an alloy having young's modulus of 200 GPa or less, and the diffusion barrier layer or the adhesive layer includes a metal or an alloy including Cu or Nb, and the adhesive layer includes Nb, the diffusion barrier layer includes Nb, and the bonding layer includes Au—Sn.

8. The light emitting device as claimed in claim 7, wherein the bonding layer is formed of a metal or an alloy comprising at least one selected from the group consisting of Sn, In, Ga, Bi, Pb, and Au.

* * * * *